United States Patent [19]

Bader

[11] Patent Number: 5,043,945
[45] Date of Patent: Aug. 27, 1991

[54] MEMORY WITH IMPROVED BIT LINE AND WRITE DATA LINE EQUALIZATION

[75] Inventor: Mark D. Bader, Austin, Tex.

[73] Assignee: Motorola, Inc., Schaumburg, Ill.

[21] Appl. No.: 402,733

[22] Filed: Sep. 5, 1989

[51] Int. Cl.$^5$ .................... G11C 7/00; G11C 11/40
[52] U.S. Cl. .................... 365/190; 365/203; 365/204
[58] Field of Search .................... 365/203, 204, 189.11, 365/190, 189.01

[56] References Cited

U.S. PATENT DOCUMENTS

| | | | |
|---|---|---|---|
| 4,110,840 | 8/1978 | Abe et al. | 365/203 |
| 4,355,377 | 10/1982 | Sud et al. | 365/203 |
| 4,402,066 | 8/1983 | Itoh et al. | 365/203 |
| 4,712,194 | 12/1987 | Yamaguchi et al. | 365/203 |
| 4,712,197 | 12/1987 | Sood | 365/203 |
| 4,751,680 | 7/1988 | Wang et al. | 365/203 |
| 4,802,129 | 1/1989 | Hoekstra et al. | 365/203 |
| 4,881,203 | 11/1989 | Watanabe et al. | 365/203 |
| 4,899,317 | 2/1990 | Hoekstra et al. | 365/190 |
| 4,926,383 | 5/1990 | Kerhs et al. | 365/203 |

FOREIGN PATENT DOCUMENTS 0084491 3/1989 Japan .................... 365/203

OTHER PUBLICATIONS

Ochii et al., "An Ultralow Power 8K×8-Bit Full CMOS RAM with a Six Transistor Cell", IEEE Journal of Solid State Circuits, vol. SC-17, No. 5, Oct. 1982, pp. 798-803.

*Primary Examiner*—Glenn Gossage

[57] ABSTRACT

A memory for performing read cycles and write cycles has memory cells located at intersections of word lines and complementary bit line pairs. A row decoder receives a row address and drives a word line in response. In the read cycle, a column decoder decodes a column address to couple selected bit line pairs to global data lines for subsequent output. In the write cycle, write global data lines receive input data signals and couple them to selected bit line pairs for storage in memory cells located at intersections of the selected bit line pairs and enabled word lines. After the write cycle, equalization of bit lines is achieved partly by bit line loads coupled to each bit line, and partly by write data line loads located in the column decoder. Because the write data line loads are coupled to the bit lines after column decoding has taken place, the write data line loads can be shared by several bit line pairs. Thus, layout space is saved due to the sharing, and transistors in the write data line load can be made larger to improve the speed of the bit line equalization.

13 Claims, 3 Drawing Sheets

MEMORY WITH IMPROVED BIT LINE AND WRITE DATA LINE EQUALIZATION

FIELD OF THE INVENTION

This invention relates generally to memories having a read mode and a write mode, and more particularly, to memories storing data bits in memory cells and providing data to and receiving data from these memory cells via pairs of complementary signal lines.

BACKGROUND OF THE INVENTION

In an MOS static random access memory (SRAM), a data bit of a memory cell is typically read and written by a signal represented as a differential voltage between two bit lines. Multiple memory cells are coupled to one bit line pair and form a column of the memory, with each memory cell located on one row of the column. Each memory cell has a unique address at an intersection of a row and a column. The bit line pairs are commonly used for both reading data from and writing data to the memory cell. Using the differential bit line pairs in such a way creates certain problems. Consider the case of a by-one ($\times 1$) memory. A $\times 1$ memory is organized to read or store one bit per address; similarly, a $\times 8$ memory is organized to read or store eight bits per address. In the $\times 1$ memory, when a write cycle begins, a data bit is provided to the memory and an address selects one memory cell to which the data bit is to be written. The data bit is received into the memory and driven onto a pair of write global data lines, which extend form one end of the memory to another end and, through further decoding, onto a selected bit line pair. The data bit is driven onto the bit line pair as a differential voltage between the two bit lines. The differential voltage is large enough to overwrite an existing value in the selected memory cell. Typically the differential voltage on the bit lines is approximately 3 volts. When a read cycle takes place, a selected memory cell provides a data bit stored within the selected memory cell as a differential voltage on the bit line pair. The differential voltage for the read cycle is approximately 300 millivolts.

A problem arises when a write cycle is completed and a read cycle begins. The differential voltage remaining on the bit line pair at the end of the write cycle must be reduced to a level low enough so that the data is not erroneously written into a memory cell during the ensuing read cycle. The differential voltage on the bit line pair must also be reduced quickly so that the read cycle is not unnecessarily extended. This process is called equalization. Equalization may include either coupling a first bit line of a bit line pair to a second bit line of the bit line pair so that their voltages will approach each other or coupling both lines to a reference voltage, commonly a 5 volt power supply voltage terminal $V_{DD}$, or both. However achieved, equalization must make the voltages on the first and second bit lines of the bit line pair close enough so that data is not overwritten and that the correct data is sensed quickly during the read cycle. The requirement of the equalization circuitry to quickly equalize the voltages on the bit line pairs is embodied in a timing specification known as TWHAX, or the time from a write signal high, or inactive, to an address invalid, signifying a change in address as a start of the read cycle. SRAMs require increasingly fast read access times, and correspondingly, improved values for TWHAX.

Equalization is typically achieved by placing a circuit known as a bit line load on each of the bit line pairs. At the termination of the write cycle the bit line loads either couple the first bit line to the second bit line of the bit line pairs, or couple each bit line to a power supply voltage terminal such as $V_{DD}$, or both. Because of the speed required, capacitive loading on the bit lines is not insignificant, and a rise time caused by such capacitance and a resistance of the bit lines limit the speed at which the bit lines equalize. As memory sizes increase capacitance increases, since capacitance is proportional to the conductor area. Another problem with a typical way of performing equalization by bit line loads is caused by decreasing geometries of memory cells. Columns with multiple memory cells coupled to them are placed adjacent to each other. In order for the bit line load not to increase column width, the bit line loads must fit within the width of the memory cells in the column. This requirement restricts the size of transistors in the bit line loads, which causes the equalization to proceed more slowly and worsens TWHAX.

An apparatus for equalizing the bit lines via the global data lines is taught by Abe et al in U.S. Pat. No. 4,110,840, entitled "Sense Line Charging System for Random Access Memory". The global data lines used by Abe et al. are tied to multiple bit line pairs and are used to sense data during the read cycle. However, as memory sizes have increased, this approach has become less valuable, because the length of the global data lines has increased the amount of capacitance on the bit line pairs during a read cycle, which considerably slows equalization performed by such a load.

BRIEF DESCRIPTION OF THE INVENTION

Accordingly, it is an object of the present invention to provide a memory with improved bit line equalization.

It is another object of the present invention to provide a method of equalizing a voltage on a bit line pair to allow faster write cycle to read cycle transitions.

In carrying out these and other objects of the invention, there is provided, in one form, a memory for performing read cycles and write cycles, comprising a plurality of memory cells, a row decoder, a first equalization portion, a column address portion, a write data line decoder, and a second equalization portion. The plurality of memory cells are located at intersections of word lines and bit line pairs. Each memory cell provides a differential voltage to the bit line pair to which it is coupled in response to a data bit stored therein when selected during a read cycle, and stores a data bit in response to a differential voltage on the bit line pair to which it is coupled when selected during a write cycle, when the word line to which it is coupled is enabled. The row decoder is coupled to the word lines, and receives a first address and enables a word line in response to the first address. The first equalization portion is coupled to the bit line pairs and equalizes a voltage between a first bit line and a second bit line of the bit line pair in response to a first equalization signal. The column address portion is coupled to the plurality of bit line pairs, and selects a predetermined number of bit line pairs in response to a second address, and is coupled each of the predetermined number of bit line pairs to a corresponding global data line pair in response to a write signal becoming inactive. The write data line decoder is coupled to the predetermined numbers of bit line pairs, and is coupled each bit line pair of the predetermined number of bit line pairs to a corresponding write data line pair in response to the write signal becoming inactive. The second equalization portion is coupled to the write data line decoder, and equalizes a voltage between a first write data line and a second write data line of each write data line pair to equalize further voltages on the predetermined number of bit line pairs, in response to a second equalization signal.

These and other objects, features and advantages will be more clearly understood from the following detailed description taken in conjunction with the accompanying drawings.

DETAILED DESCRIPTION OF THE INVENTION

Figure 1:
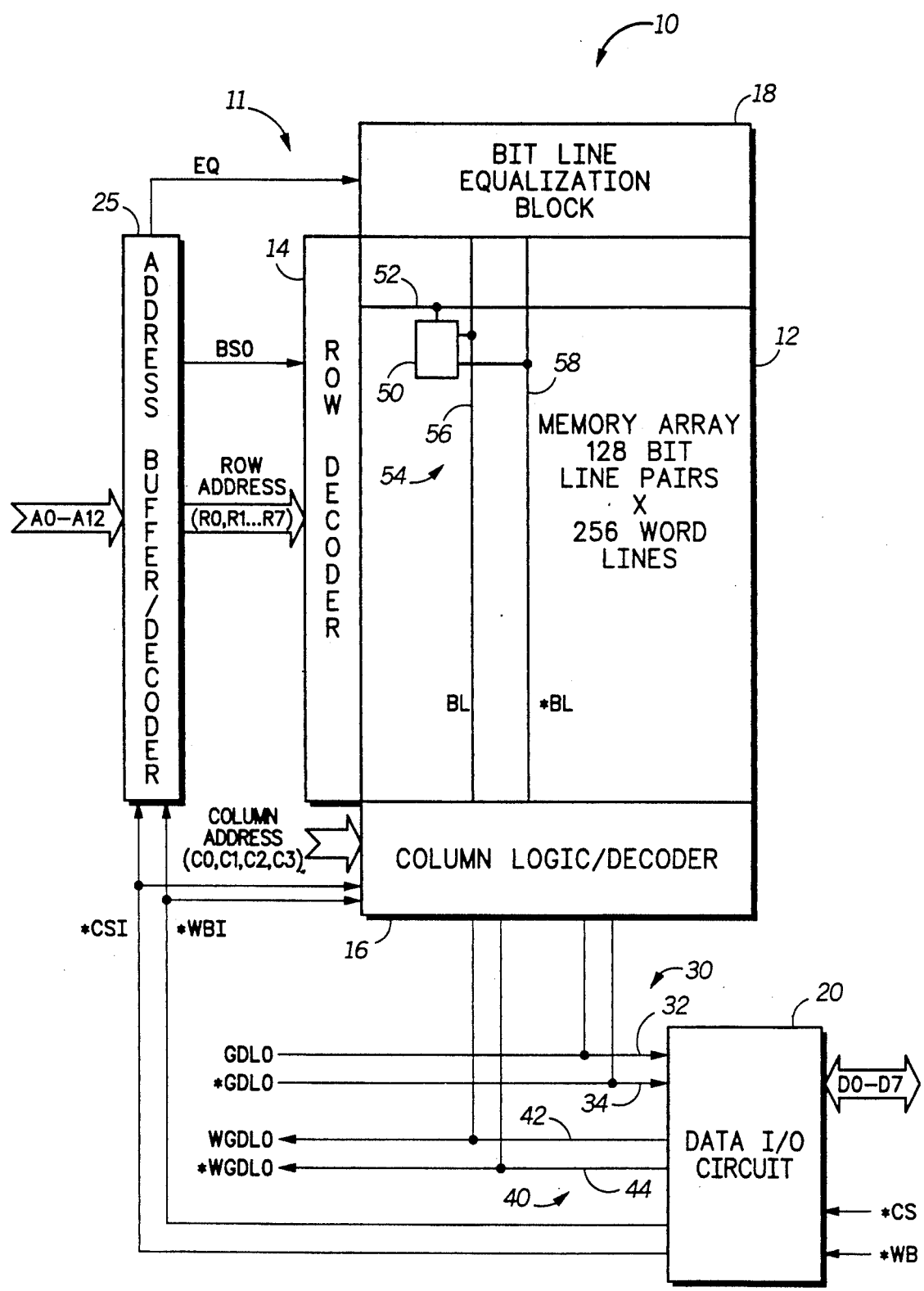
FIG. 1 illustrates in block form a memory in accordance with the present invention.

Shown in FIG. 1 is a memory 10 in accordance with the present invention. Memory 10 generally comprises an address buffer/decoder 25, a memory block 11, a data I/O circuit 20, a pair of global data lines 30, and a pair of write global data lines 40. Memory block 11 is a representative memory block and other memory blocks may be present. Memory block 11 comprises memory array 12, a row decoder 14, a column logic/decoder 16, and a bit line equalization block 18. Memory array 12 comprises 256 word lines and 128 bit line pairs, and memory cells located at intersections of the word lines and the bit line pairs. Shown in FIG. 1 is a representative memory cell 50 located at an intersection of a word line 52 and a bit line pair 54. Bit line pair 54 comprises a first bit line 56, and a second bit line 58. Global data line pair 30 comprises a first global data line 32, and a second global data line 34. Write global data line pair 40 comprises a first write global data line 42, and a second write global data line 44.

Address buffer/decoder 25 receives an address on address lines A0, A1, A2, A3, A4, A5, A6, A7, A8, A9, A10, A11, and A12. Address buffer/decoder 25 also receives signals *WBI and *CSI. An asterisk (*) before a signal indicates that the signal is active at a logic low. Address buffer/decoder 25 provides a block select signal BSO, a row address R0, R1, R2, R3, R4, R5, R6, and R7, and an equalization signal EQ. A typical SRAM will have other memory blocks in additional to memory block 11. In such case, address buffer/decoder 25 would also provide block select signals for the other memory blocks, in memory 10.

In memory block 11, row decoder 14 receives block select signal BSO and a row address R0-R7, and selects one of 256 word lines in response thereto. Memory array 12 receives 256 word lines from row decoder 14. Memory cells in memory array 12 are located at intersections of 256 word lines and 128 bit line pairs and coupled to a word line and to a bit line pair. Each bit line pair serves as an input to the memory cells during the write cycle of memory 10 and as an output during the read cycle. A representative memory cell 50 is shown. Memory cell 50 is coupled to word line 52, and to bit line pair 54. Bit line equalization block 18 receives signal EQ from address buffer/decoder 25, and is coupled to each of 128 bit line pairs of memory array 12. Column logic/decoder 16 receives a column address C0, C1, C2, and C3, *WBI, and *CSI. Column logic/decoder 16 is coupled to each bit line pair, including representative bit line pair 54, and is coupled to global data line pair 30 and write global data line pair 40. Data I/O circuit 20 receives signals GDL0 and *GDL0 on global data line pair 30, *WB, *CS, and input/output signals D0, D1, D2, D3, D4, D5, D6, and D7, and provides signals *WBI, *CSI, and WGDL0 and *WGDL0 on write global data line pair 40.

In a preferred embodiment, memory 10 is configured as a ×8 memory. However, memory 10 could also be configured as ×4 or a ×1 memory. Signals GDL0, *GDL0, WGDL0, and *GDL0 represent signals for data bit D0; other corresponding signals for data bits D1-D7 are not shown for ease of illustration. Similarly, the seven other global data line pairs and write global data line pairs are also not shown. Address buffer/decoder 25 receives enough address bits to select one of 32 blocks. It should be apparent that different 93numbers of blocks, different sizes of blocks, and different organizations could be used.

In basic operation, address buffer/decoder 25 receives an address on address lines A0-A12 during a read cycle or a write cycle of memory 10. In the read cycle, *CSI is active and *WBI is inactive, during the write cycle, *CSI and *WBI are both active. Signals *WBI and *CSI are buffered from input signals *WB and *CS and are substantially the same signals, respectively. Signal BS0 is decoded from A0-A12, and when active enables memory block 11. Row decoder 14 then enables one word line in response to a row address on signals R0-R7. During the read cycle, each memory cell which is coupled to an enabled word line is selected and provides its output as a differential voltage on a corresponding bit line pair. For example, when row address R0-R7 enables word line 52, memory cell 50 is selected and provides a bit stored in memory cell 50 to corresponding bit line pair 54. All 128 bit line pairs during the read cycle provide the contents of memory cells coupled to the enabled word line. A signal on a bit line pair is a differential voltage, and the differential voltage during the read cycle is approximately 300 millivolts.

Column logic/decoder 16 selects eight of 128 bit line pairs based on column address C0-C3. *CSI provides information to column logic/decoder 16 that an operation has begun, and *WBI determines whether a read cycle or a write cycle is in progress. After decoding eight bit line pairs based on the column address, column logic/decoder 16 couples each of the eight selected bit line pairs to a corresponding global data line pair and amplifies a signal thereon. In response to *CS becoming active and *WB becoming inactive, data I/O circuit 20 receives a differential signal on each global data line pair, converts the differential signal to a single ended signal, and outputs D0-D7.

Figure 2:
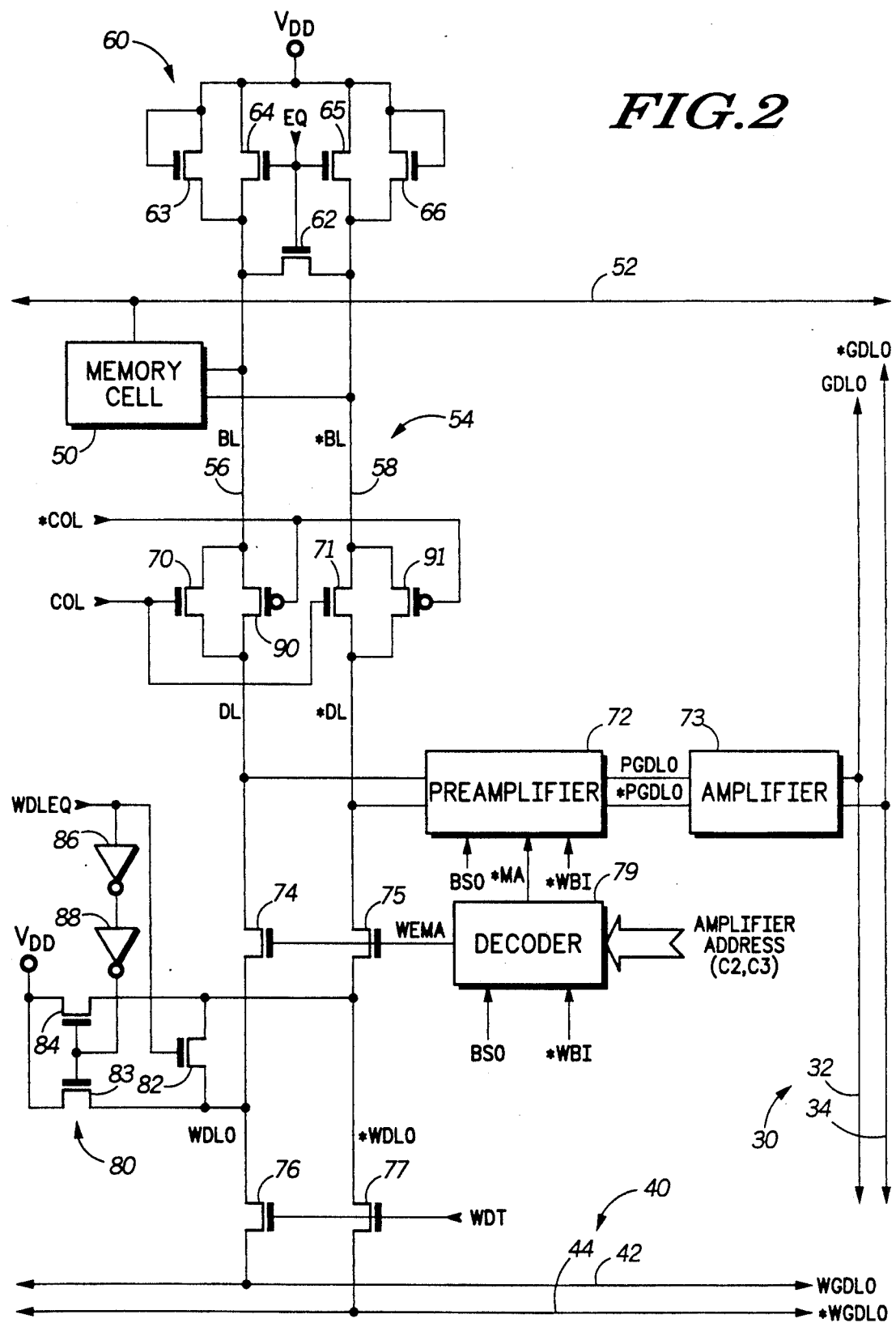
FIG. 2 is a combination block diagram and circuit diagram of a portion of the memory of FIG. 1.

During the write cycle the flow of data is essentially reversed. A write cycle is signified by both *CS and *WB becoming active. Data I/O circuit 20 receives D0-D7, and provides each data signal as a differential signal on a corresponding write global data line pair. Write global data line pair 40 is driven by data I/O circuit 20 based on D0. Write global data line pair 40 is representative of each of eight write global data line pairs in memory 10. In response to *CSI, *WBI, and the column address, column logic/decoder 16 couples eight write global data line pairs to selected bit line pairs. Row decoder 14 enables a word line and the input data is driven into memory cells located at intersections of enabled word lines and selected bit line pairs. As in the read cycle, memory cells located on an enabled word line provide outputs to bit line pairs. However a voltage differential driven on bit line pairs by column logic/decoder 16 is greater than the drive voltage of the memory cell and overwrites a stored bit in the memory cell. The differential voltage driven onto the bit line pairs during the write cycle is approximately 3.0 volts. Equalization of the bit line pairs is achieved in part by bit line equalization block 18, which serves as a first equalization portion, and in part by column logic/decoder 16, which serves as a second equalization portion. FIG. 2 illustrates operation of bit line equalization block 18 and column logic/decoder 16 in equalization of a bit line pair after a write cycle.

FIG. 2 shows a partial block diagram and a partial circuit diagram of portions of memory 10 of FIG. 1. FIG. 2 generally comprises global data line pair 30, write global data line pair 40, memory cell 50, word line 52, bit line pair 54, a bit line load 60, an N-channel transistor 70, a P-channel transistor 90, an N-channel transistor 71, a P-channel transistor 91, a preamplifier 72, an amplifier 73, an N-channel transistor 74, an N-channel transistor 75, an N-channel transistor 76, an N-channel transistor 77, a decoder 79, and a write data line load 80. Elements in common with FIG. 1 are similarly numbered. Bit line load 60 comprises an N-channel transistor 62, an N-channel transistor 63, an N-channel transistor 64, an N-channel transistor 65, and an N-channel transistor 66. Write data line load 80 comprises an N-channel transistor 82, an N-channel transistor 83, an N-channel transistor 84, an inverter 86, and an inverter 88.

In bit line load 60, transistor 62 has a source connected to bit line 56, a gate for receiving signal EQ, and a drain connected to bit line 58. Transistor 63 has a drain connected to $V_{DD}$, a gate connected to $V_{DD}$, and a source connected to bit line 56. Transistor 64 has a drain connected to $V_{DD}$, a gate for receiving signal EQ, and a source connected to bit line 56. Transistor 65 has a drain connected to $V_{DD}$, a gate connected to EQ, and a source connected to bit line 58. Transistor 66 has a drain connected to $V_{DD}$, a gate connected to $V_{DD}$, and a source connected to bit line 58.

Transistor 70 has a drain connected to bit line 56, a gate for receiving a signal COL, and a source. Transistor 90 has a source connected to bit line 56, a gate for receiving a signal *COL, and a drain connected to the source of transistor 70. The source of transistor 70 receives a data line signal DL during the write cycle, and provides DL during the read cycle. Transistor 71 has a drain connected to bit line 58, a gate for receiving COL, and a source. Transistor 91 has a source connected to bit line 58, a gate for receiving *COL, and a drain connected to the source of transistor 71. The source of transistor 71 receives a data line signal *DL during the write cycle, and provides *DL during the read cycle. Preamplifier 72 receives DL and *DL, *WBI, BS0, and an enable signal *MA, and provides pre-global data line signals PGDL0 and *PGDL0. Amplifier 73 receives PGDL0 and *PGDL0 and is coupled to global data line 32 and global data line 34 of global data line pair 30. Transistor 74 has a drain connected to the source of transistor 70, a gate connected to a signal WEMA, and a source for receiving a write data line signal WDL0. Transistor 75 has a drain connected to the source of transistor 71, a gate for receiving signal WEMA, and a source for receiving a write data line signal *WDL0. Transistor 76 has a drain coupled to the source of transistor 74 and providing WDL0 thereto, a gate for receiving a signal WDT, and a source coupled to write global data line 42. Transistor 77 has a drain connected to the source of transistor 75 and providing *WDL0 thereto, a gate for receiving WDT, and a source connected to write global data line 44. Decoder 79 receives column address signals C2 and C3, *WBI, and BS0, and provides *MA and WEMA.

In write data line load 80, transistor 82 has a drain connected to the source of transistor 74, a gate for receiving a write data line equalization signal WDLEQ, and a source connected to the source of transistor 75. Transistor 83 has a drain connected to $V_{DD}$, a gate, and a source connected to the drain of transistor 82. Transistor 84 has a drain connected to $V_{DD}$, a gate, and a source connected to the source of transistor 82. Inverter 86 has an input terminal for receiving WDLEQ, and an output terminal. Inverter 88 has an input terminal connected to the output terminal of inverter 86, and an output terminal connected to the gate of transistor 83 and to the gate of transistor 84.

FIG. 2 shows a representative portion of memory 10 of FIG. 1 embodying the present invention. In FIG. 2, data line load 80 improves voltage equalization of bit line pair 54 after the write cycle. During the write cycle, D0 is driven by data I/O block 20 of FIG. 1 as a differential signal onto write global data line pair 40. WDT becomes active, and transistors 76 and 77 receive the differential signal on write global data lines 42 and 44 and provide WDL0 and *WDL0, respectively. During the write cycle, WDLEQ is inactive, which makes transistors 82, 83, and 84 nonconductive and disables write data line load 80. WEMA is active when C2 and C3 select the column of memory cell 50. When WEMA is active, transistors 74 and 75 are conductive and couple DL and *DL to WDL0 and *WDL0, respectively. *WBI is active during the write cycle and disables preamplifier 72. COL and *COL are decoded from column address signals C1 and C2 by column logic/decoder 16 of FIG. 1, and are active when C1 and C2 select bit line pair 54. Three other bit line pairs besides bit line pair 54 are coupled to signals DL and *DL when a corresponding decoded signal is active. When COL and *COL are active transistors 70 and 71, 90 and 91 become conductive and drive voltages on DL and *DL onto bit lines 56 and 58, respectively. Transistors 90 and 91 are included in parallel with transistors 70 and 71 because P-channel transistors are better able to pass a high level on bit line pair 54. If the row of memory cell 50 is enabled, word line 52 is enabled and selects memory cell 50. The differential voltage on bit line pair 54 represents a data bit to be stored in memory cell 50, and a differential component between bit line 56 and bit line 58 is approximately 3.0 volts. The differential component is strong enough to overwrite a bit stored in memory cell 50.

The write cycle terminates in response to *WB becoming inactive. The differential voltage on bit line pair 54 must be equalized within a time specified by TWHAX. Equalization is accomplished partly by bit line load 60 acting as a first equalization portion, and partly by write data line load 80 acting as a second equalization portion. Use of write data line load 80 improves equalization of memory 10 of FIG. 1 over a prior art design utilizing only bit line equalization, or of equalization occurring on both bit lines and on global data lines, as taught by Abe in U.S. Pat. No. 4,110,840, referred to earlier.

Bit line load 60, which is coupled to bit line pair 54, couples bit line 56 to bit line 58 after the termination of the write cycle and in response to *WBI becoming inactive. After the write cycle terminates, EQ becomes active. EQ makes transistor 62 conductive, coupling bit line 56 to bit line 58. EQ also makes transistors 64 and 65 conductive, coupling both bit lines 56 and 58 to $V_{DD}$. Transistors 63 and 66 are always conductive to maintain a static voltage on unselected bit line pairs during the write cycle. In the preferred embodiment, thresholds of transistors 63-66 are lower than a threshold of transistor 62, so that transistors 63-66 pull bit line pair 54 to $V_{DD}$ strongly, but such a sizing relationship is not necessary. Sizes of transistors in bit line load 60 are limited by a width of the column, as well as by peak current requirements and by capacitive loading on EQ. To prevent enlarging the width of the column, transistors 62-66 must be limited in size, preventing bit line load 60 from equalizing the differential voltage on bit lines 56 and 58 quickly.

Transistors in write data line load 80 can be sized approximately four times as large as transistors in bit line load 60 because write data line load 80 is shared between four bit line pairs. After the write cycle terminates, preamplifier 72 remains decoupled from signals DL and *DL for several nanoseconds. After *WBI becomes inactive, WDT becomes active and decouples write global data lines 42 and 44 from WDL0 and *WDL0, respectively, WEMA, COL, and *COL remain active for several nanoseconds after WDT becomes inactive. During this time WDLEQ becomes active asserts, making transistor 82 conductive. A short time later, due to the propagation of signal WDLEQ through inverters 86 and 88, transistors 83 and 84 become conductive. When transistor 82 becomes conductive, bit lines 56 and 58 are coupled together through transistor 82, which is approximately four times as large as transistor 62. A short time later, transistors 83 and 84 become conductive, coupling bit lines 56 and 58 to $V_{DD}$ through transistors that are approximately four times as large as transistors 63, 64, 65, or 66. Furthermore preamplifier 72 remains decoupled from bit lines 56 and 58 long enough for the voltage on bit lines 56 and 58 to equalize properly. If write data line load 80 were coupled to global data lines 32 and 34, equalization would proceed more slowly, because of large capacitance on global data lines 32 and 34 caused by global data lines 32 and 34 spanning approximately an entire length of an integrated circuit.

Figure 3:
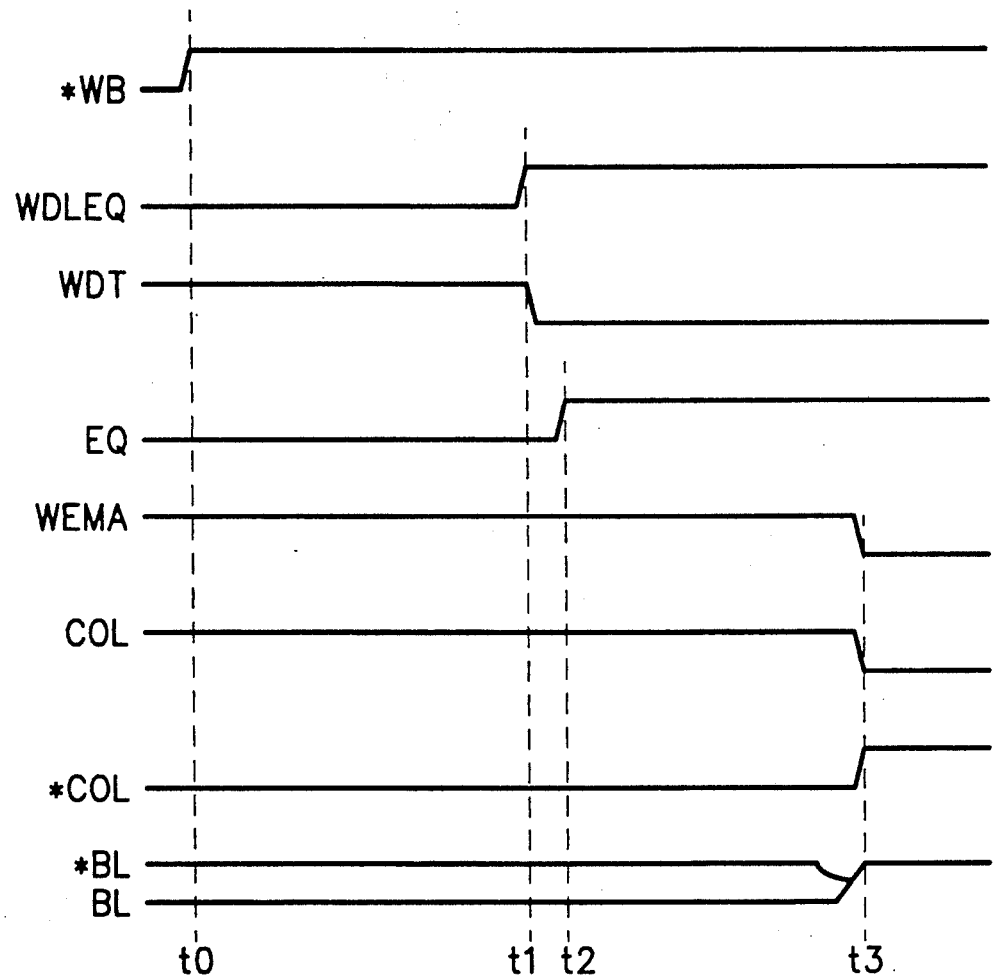
FIG. 3 shows a timing diagram useful in understanding the operation of the portion of the memory of FIG. 2.

FIG. 3 shows a timing diagram for signals involved in equalization, after the termination of a write cycle in which memory block 50 of FIG. 2 was selected. *WB switches from a logic low to a logic high at time t0, signifying the termination of the write cycle. At time t1, WDLEQ switches from a logic low to a logic high, enabling write data line load 80, and WDT switches from a logic high to a logic low, decoupling write global data line pair 40 from bit line pair 54. Shortly after, at time t2, EQ becomes active, coupling bit line 56 to bit line 58 and coupling bit lines 56 and 58 to VDD through transistors 64 and 65, respectively. At t3, WEMA becomes inactive, decoupling write data line load 80 from bit line pair 54, and COL and *COL become inactive, deselecting bit line pair 54. By this time, voltages BL and *BL on bit lines 56 and 58, respectively, have equalized sufficiently, by approaching one another due to action of transistors 62 and 82, and by reaching approximately $V_{DD}$ minus a threshold of transistor 64 or 65, caused by action of transistors 63-66 and 83 and 84. In the preferred embodiment, if t0 represents 0 nanoseconds, t1, t2, and t3 will be approximately 4.2, 4.9, and 8.5 nanoseconds, respectively; however values for t1, t2, and t3 may vary as long as relative timing of signals shown in FIG. 3 is maintained.

It should be apparent by now that coupling write data line load 80 to bit line pair 54 improves equalization speed, because sharing of write data line load 80 between four bit line pairs allows larger transistors to be used. Furthermore, by being decoupled from both global data line pair 30 and write global data line pair 40, write data line load 80 improves equalization over a prior art design in which extra equalization was performed on global data lines. While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A memory comprising:
   a plurality of memory cells;
   a plurality of bit line pairs, coupled to the plurality of memory cells, wherein each memory cell is coupled to one of the plurality of bit line pairs;
   first equalization means coupled to the plurality of bit line pairs, for equalizing voltages on each pair of said plurality of bit line pairs in response to a first equalization signal;
   first decoding means coupled to the plurality of memory cells and to the plurality of bit line pairs, for selecting at least one of said plurality of memory cells, and for coupling at least one bit line pair to a corresponding data line pair of a plurality of data line pairs;
   global data line means coupled to the plurality of data line pairs, for providing a data bit from each corresponding data line pair of the at least one selected memory cell during a read cycle thereof;
   second equalization means coupled to a plurality of write data line pairs, for equalizing voltages on each write data line pair in response to a second equalization signal, said second equalization signal becoming active substantially when said first equalization signal becomes active; and
   second decoding means coupled to said data line pairs, for coupling each data line pair to a corresponding write data line pair during said write cycle, and for decoupling said write data line pairs from said data line pairs a predetermined period after said first and second equalization signals become active.

2. The memory of claim 1, wherein the second equalization means comprises at least one write data line load, each write data line load coupled to a corresponding write data line pair, wherein each write data line load comprises:
   a first transistor, having a first current electrode coupled to the first write data line of an associated write data line pair, a control electrode for receiving the second equalization signal, and a second current electrode coupled to the second write data line of the associated write data line pair;

a second transistor, having a first current electrode coupled to the first write data line of the associated write data line pair, a control electrode for receiving the second equalization signal, and a second current electrode coupled to the power supply voltage terminal; and a third transistor, having a first current electrode coupled to the second write data line of the associated write data line pair, a control electrode for receiving the second equalization signal, and a second current electrode coupled to the power supply voltage terminal.

3. The memory of claim 1, wherein the first equalization means comprises a plurality of bit line loads, each of said plurality of bit line loads coupled to an associated one of said plurality of bit line pairs, wherein each bit line load comprises:

a first transistor, having a first current electrode coupled to a first bit line of an associated bit line pair, a control electrode for receiving said first equalization signal, and a second current electrode coupled to a second bit line of the associated bit line pair;

a second transistor, having a first current electrode coupled to the first bit line of the associated bit line pair, a control electrode for receiving said first equalization signal, and a second current electrode coupled to a power supply voltage terminal; and a third transistor, having a first current electrode coupled to the second bit line of the associated bit line pair, a control electrode for receiving said first equalization signal, and a second current electrode coupled to the power supply voltage terminal.

4. The memory of claim 3, wherein each bit line load further comprises:

a fourth transistor, having a first current electrode coupled to the first bit line of the associated bit line pair, a control electrode coupled to the power supply voltage terminal, and a second current electrode coupled to the power supply voltage terminal; and a fifth transistor, having a first current electrode coupled to the second bit line of the associated bit line pair, a control electrode coupled to the power supply voltage terminal, and a second current electrode coupled to the power supply voltage terminal.

5. A memory for performing read cycles and write cycles, comprising:

a plurality of memory cells located at intersections of word lines and bit line pairs, each memory cell for providing a differential voltage to the bit line pair to which it is coupled in response to a data bit stored therein when selected during a read cycle, and for storing a data bit in response to a differential voltage on the bit line pair to which it is coupled when selected during a write cycle, when the word line to which it is coupled is enabled;

row decoder means coupled to the word lines, for receiving a first address, and for enabling a word line in response to the first address;

first equalization means coupled to the bit line pairs, for equalizing a voltage between a first bit line and a second bit line of each bit line pair in response to a first equalization signal;

column address means coupled to the plurality of bit line pairs, for selecting a predetermined number of bit line pairs in response to a second address, and for coupling each of the predetermined number of bit line pairs to a corresponding global data line pair in response to a write signal becoming inactive;

write data line decoding means coupled to the predetermined number of bit line pairs, for coupling each bit line pair of the predetermined number of bit line pairs to a corresponding write data line pair of a plurality of write data line pairs in response to the write signal becoming active; and second equalization means coupled to the write data line decoding means, for equalizing a voltage between a first write data line and a second write data line of each write data line pair to equalize further voltages on said predetermined number of bit line pairs, in response to a second equalization signal.

6. A memory comprising:

a plurality of memory cells, each memory cell coupled to true and complement bit lines of a bit line pair, for storing a data bit corresponding to a differential voltage between said true and complement bit lines when selected during a write cycle, and for providing a differential voltage between said true and complement bit lines corresponding to said data bit when selected during a read cycle;

row decoding means coupled to said plurality of memory cells, for selecting a memory cell in response to a first portion of an address;

a bit line coupled to said bit line pair, for equalizing a voltage between said true and complement bit lines in response to a first signal;

column decoding means coupled to said bit line pair, for coupling said bit line pair to a data line pair in response to a second portion of said address, and for further coupling said data line pair to a write data line pair in response to a second signal; and a write data line load coupled to said write data line pair, for equalizing voltages between true and complement write data lines of said write data line pair in response to a third signal;

said first and third signals being inactive during said write cycle and becoming active substantially a first predetermined period after a termination of said write cycle, said second signal being active during said write cycle and becoming inactive a second predetermined period after said termination of said write cycle, said second predetermined period being longer than said first predetermined period.

7. The memory of claim 6 further comprising coupling means, for coupling said write data line pair to a write global data line pair during a write cycle.

8. The memory of claim 7 further comprising read sensing means, coupled to said data line pair, for sensing a differential voltage between said true and complement data lines of said data line pair during a read cycle.

9. A method for performing a write cycle in a memory and for equalizing voltages on a pair of bit lines after a termination of the write cycle, the memory comprising a plurality of memory cells, each memory cell for providing a pair of complementary bit line signals to a bit line pair when selected during a read cycle, and for storing a data bit received on the bit line pair during the write cycle, wherein the write cycle is performed in response to a write signal, the method comprising the steps of:

selecting a predetermined set of memory cells in response to a first address during the write cycle, said predetermined set of memory cells respectively coupled to a plurality of bit line pairs;

decoding a second address to select at least one bit line pair, wherein each selected bit line pair is coupled to a corresponding data line pair of a plurality of data line pairs;

coupling one of said data line pairs to a write data line pair in response to a third address;

receiving a data bit as a differential voltage between first and second write data lines of said write data line pair;

equalizing said write data line pair in response to the write signal becoming inactive;

equalizing each bit line pair; and decoupling each data line pair from a corresponding write data line pair.

10. The method of claim 9, wherein said step of equalizing each bit line pair comprises:

coupling a first bit line of each bit line pair to a second bit line of that said bit line pair; and coupling that said first bit line and that second bit line to a power supply voltage terminal.

11. The method of claim 9, wherein said step of equalizing each write data line pair comprises:

coupling a first write data line of said write data line pair to a second write data line of said write data line pair; and coupling said first write data line and said second write data line to a power supply voltage terminal.

12. A memory comprising:

a plurality of memory cells;

a plurality of bit line pairs, coupled to the plurality of memory cells, wherein each memory cell is coupled to one of the plurality of bit line pairs;

first equalization means coupled to the plurality of bit line pairs, for equalizing voltages on each pair of said plurality of bit line pairs a first predetermined period after a termination of a write cycle of said memory;

first decoding means coupled to the plurality of bit line pairs, for coupling at least one bit line pair to a corresponding data line pair of a plurality of data line pairs;

second decoding means coupled to said data line pairs, for coupling each data line pair to a corresponding write data line pair of a plurality of write data line pairs during said write cycle, and for decoupling said write data line pairs from said data line pairs a second predetermined period after a termination of said write cycle; and second equalization means coupled to each write data line pair, for equalizing voltages on each write data line pair a third predetermined period after said write cycle, said second predetermined period being longer than both said first predetermined period and said third predetermined period.

13. The memory of claim 12 further comprising global data line means coupled to the plurality of data line pairs, for providing a data bit from a data line pair coupled to a selected memory cell during a read cycle of the memory.

* * * * *

UNITED STATES PATENT AND TRADEMARK OFFICE
CERTIFICATE OF CORRECTION

PATENT NO. : 5,043,945

DATED : August 27, 1991

INVENTOR(S) : Mark D. Bader

It is certified that error appears in the above-identified patent and that said Letters Patent is hereby corrected as shown below:

Column 10, line 32, after "line", insert --load--.
Column 11, line 22, after "that", delete "said".
Column 11, line 23, after "that", delete "said".

Signed and Sealed this

Thirteenth Day of April, 1993

Attest:

STEPHEN G. KUNIN

*Attesting Officer*     *Acting Commissioner of Patents and Trademarks*